United States Patent
Munson et al.

(10) Patent No.: US 6,937,020 B2
(45) Date of Patent: Aug. 30, 2005

(54) SOLID-STATE NUCLEAR MAGNETIC RESONANCE PROBE

(75) Inventors: Eric Jon Munson, Lawrence, KS (US); Thomas James Offerdahl, Lawrence, KS (US); Loren Joseph Schieber, Fairway, KS (US)

(73) Assignee: The University of Kansas, Lawrence, KS (US)

( * ) Notice: Subject to any disclaimer, the term of this patent is extended or adjusted under 35 U.S.C. 154(b) by 0 days.

(21) Appl. No.: 10/772,778

(22) Filed: Feb. 4, 2004

(65) Prior Publication Data

US 2004/0222796 A1 Nov. 11, 2004

Related U.S. Application Data (60) Provisional application No. 60/445,288, filed on Feb. 4, 2003.

(51) Int. Cl.$^7$ ................................................ G01V 3/00
(52) U.S. Cl. ........................................ 324/321; 324/320
(58) Field of Search ................................ 324/321, 318, 324/319, 320, 300, 306, 307, 309

(56) References Cited

U.S. PATENT DOCUMENTS

| | | | | |
|---|---|---|---|---|
| 4,654,592 | A | * 3/1987 | Zens | 324/307 |
| 5,146,166 | A | * 9/1992 | Bartuska | 324/321 |
| 5,200,702 | A | * 4/1993 | Lilly et al. | 324/321 |
| 6,426,058 | B1 | 7/2002 | Pines et al. | |
| 6,686,740 | B2 | * 2/2004 | Tschirky et al. | 324/321 |
| 6,696,838 | B2 | 2/2004 | Raftery et al. | |
| 2002/0130661 | A1 | 9/2002 | Raftery et al. | |

OTHER PUBLICATIONS

"U6 Serial SP6T (Full Size–High Power), DC–12.4 GHz, TYPE N(F) Connectors, Failsafe, Latching, Momentary," Charter Engineering, Inc, http://www.cciswitchers.com/U6.asp, 6 pgs. (printed Jan. 2, 2003).

Abragam, A., "The Principles Of Nuclear Magnetism," The International Series of Monographs On Physics, pp. 1–69 (© 1961).

Bennett, A. et al., "Heteronuclear decoupling in rotating solids," J. Chem. Phys., vol. 103, No. 16, pp. 6951–6958 (Oct. 22, 1995).

Bugay, D., "Review: Solid–State Nuclear Magnetic Resonance Spectroscopy: Theory and Pharmaceutical Applications," Pharmaceutical Research, vol. 10, No. 3, pp. 317–327 (1993).

Bugay, D., "4: Magnetic Resonance Spectrometry," Physical Characterization of Pharmaceutical Solids, pp. 93–125 (© 1995).

Byrn, S. et al., "The Crystal Structure, Solid–State NMR Spectra, and Oxygen Reactivity of Five Crystal Forms of Prednisolone tert–Butylacetate," J. Am. Chem. Soc., vol. 110, pp. 1609–1614 (1988).

Byrn, S. et al., "9: Solid–State NMR Spectroscopy," Solid–State Chemistry of Drugs, Secod Edition, pp. 119–137 (© 1999).

(Continued)

Primary Examiner—Louis Arana
(74) Attorney, Agent, or Firm—Merchant & Gould P.C.

(57) ABSTRACT

A solid-state nuclear magnetic resonance probe that includes multiple sample spinning systems and detection coils is disclosed. The probe can be repositioned within the bore of the magnet to selectively maximize the throughput and sensitivity of the instrument by acquiring a spectrum from one sample at a time while at least one other sample is at or returning to an equilibrium spin state. Methods for the utilization of the probe are also disclosed.

14 Claims, 5 Drawing Sheets

OTHER PUBLICATIONS

Chen, L. et al., "Nuclear Magnetic Resonance And Infrared Spectroscopic Analysis Of Nedocromil Hydrates," *Pharm. Res.*, vol. 17, No. 5, pp. 619–624 (2000).

Dong, Z. et al., "Conformational Flexibility And Hydrogen–Bonding Patterns Of The Neotame Molecular In Its Various Solid Forms," *J. Pharm. Sci.*, vol. 91, No. 9, pp. 2047–2056 (Sep. 2002).

Dong, Z. et al., "Dehydration Kinetics Of Neotame Monohydratem" *J. Pharm. Sci.*, vol. 91, No. 6, pp. 1423–1431, (Jun. 2002).

Dong, Z. et al., "Neotame Anhydrate Polymorphs I: Preparation And Characterization," *Pharm. Res.*, vol. 19, No. 3, pp. 330–336 (Mar. 2002).

Dong, Z. et al., "Neotame Anhydrate Polymorphs II: Quantitation and Relative Physical Stability," *Pharm. Res.*, vol. 19, No. 9, pp. 1259–1264 (Sep. 2002).

Dong, Z. et al., "Crystal Structure of Neotame Anhydrate Polymorph G," *Pharm. Res.*, vol. 19, No. 10, pp. 1549–1553 (Oct. 2002).

Farrar, C. et al., "High–Frequency Dynamic Nuclear Polarization in the Nuclear Rotating Frame," *Journal of Magnetic Resonance*, vol. 144, pp. 134–141 (2000).

Farrar, C. et al., "Mechanism of dynamic nuclear polarization in high magnetic fields," *Journal of Chemical Physics*, vol. 114, No. 11, pp. 4922–4933 (Mar. 15, 2001).

Fisher, G. et al., "NMR Probe for the Simultaneous Acquisition of Multiple Samples," *Journal of Magnetic Resonance*, vol. 138, pp. 160–163 (1999).

Freeman, R., "Fourier Transformation Free Induction Decay, Intensities, Sensitivity Enhancement, Spin–Lattice Relaxation, Time Averaging," *A Handbook of Nuclear Magnetic Resonance*, pp. 80–91, 101–105, 225–229, 250–258, 283–285 (© 1988).

Fukushima, E. et al., "Chapter III Relaxation" and "Chapter IV NMR of Solids," *Experimental Pulse NMR A Nuts and Bolts Approach*, pp. 125–295 (© 1981).

Fyfe, C., et al., "Chapters 1, 2, 4, 5, 6," *Solid State NMR For Chemists*, pp. 1–31, 139–297 (© 1983).

Harris, R., "6 NMR of the solid state," *Nuclear Magnetic Resonance Spectroscopy*, pp. 144–164 (©1983 & 1986).

Hou, T. et al., "NMR analysis of multiple samples using parallel coils: improved performance using reference deconvolution and multidimensional methods," *Analytica Chimica Acta*, vol. 400, pp. 297–305 (1999).

Hou, T. et al., "Analysis of Multiple Samples Using Multiplex Sample NMR: Selective Excitation and Chemical Shift Imaging Approaches," *Anal. Chem.*, vol. 73, pp. 2541–2546 (Jun. 1, 2001).

Kodibagkar, V. et al., "Remote Tuning of NMR Probe Circuits," *Journal of Magnetic Resonance*, vol. 144, pp. 53–57 (2000).

Lesage, A. et al., "Determination of Through–Bond Carbon–Carbon Connectivities in Solid–State NMR Using the INADEQUATE Experiment," *J. Am. Chem. Soc.*, vol. 119, pp. 7867–7868 (1997).

Lesage, A. et al., "Through–Bond Carbon–Carbon Connectivities in Disordered Solids by NMR," *J. Am. Chem.*, vol. 121, pp. 10987–10993 (1999).

Leung, S. et al., "Hydration and Dehydration Behavior of Aspartame Hemihydrate," *J. Pharm. Sci.*, vol. 87, No. 4; pp. 508–513 (Apr. 1998).

Leung, S. et al., "Solid–State Characterization of Two Polymorphs of Aspartame Hemihydrate," *J. Pharm. Sci.*, vol. 87, No. 4, pp. 501–507 (Apr. 1998).

MacNamara, E. et al., "Multiplex sample NMR: an approach to high–throughout NMR using a paralle coil probe," *Analytica Chimica Acta*, vol. 397, pp. 9–16 (1999).

MacNamara, E. et al., "Cross Polarization and Cross Relaxation from Laser–Polarized Xenon to Surface Species," *J. Phys. Chem. B*, vol. 103, pp. 1158–1160 (1999).

Middleton, D. et al., "A Cross–Polarization Magic–Angle Spinning $^{13}C$ NMR Characterization of the Stable Solid–State Forms of Cimetidine," *Journal of Pharmaceutical Sciences*, vol. 86, No. 12, pp. 1400–1402 (Dec. 1997).

Munson, E., "Abstract: In Situ Solid–State Nuclear Magnetic Resonance Studies of Reactions In Zeolite Catalysts," *A Dissertation*, 7 pgs. (May 1993).

Offerdahl, T. et al., "Solid–State NMR Spectroscopy of Pharmaceutical Materials," *American Pharmaceutical Review*, pp. 1–4 (2003).

Oldfield, E. et al., "A Multiple–Probe Strategy for Ultra–High–Field Nuclear Magnetic Resonance Spectroscopy," *Journal of Magnetic Resonance, Series A*, vol. 107, pp. 255–257 (1994).

Padden, B. et al., "Comparison of Solid–State $^{13}C$ NMR Spectroscopy and Powder X–ray Diffraction for Analyzing Mixtures of Polymorphs of Neotame," *Anal. Chem.*, vol. 71, No. 16, pp. 3325–3331 (Aug. 15, 1999).

Peersen, O. et al., "Variable–Amplitude Cross–Polarization MAS NMR," *Journal of Magnetic Resonance, Series A*, vol. 104, pp. 334–339 (1993).

Pines, A. et al., "Proton–enhanced NMR of dilute spins in solids," *The Journal of Chemical Physics*, vol. 59, No. 2, pp. 569–590 (Jul. 15, 1973).

Reutzel, S. et al., "Origins of the Unusual Hygroscopicity Observed in LY297802 Tartrate," *Journal of Pharmaceutical Sciences*, vol. 87, No. 12, pp. 1568–1571 (Dec. 1998).

Rosay, M. et al., "Two–Dimensional $^{13}C-^{13}C$ Correlation Spectroscopy with Magic Angle Spinning and Dynamic Nuclear Polarization," *J. Am. Chem. Soc.*, vol. 124, pp. 3214–3215 (2002).

Saindon, P. et al., "Solid–State Nuclear Magnetic Resonance (NMR) Spectra of Pharmaceutical Dosage Forms," *Pharmaceutical Research*, vol. 10, No. 2, pp. 197–203 (1993).

Schmidt, W. et al., "Nuclear Magnetic Resonance (NMR) Spectroscopic Investigation of Interaction Energies of Ephedrine Stereoisomers in Noncrystalline Solids and Its Correlation with Thermodynamic Data," *Pharmaceutical Research*, vol. 8, No. 9, pp. 1128–1136 (1991).

Serber, Z. et al., "New Carbon–Detected Protein NMR Experiments Using CryoProbes," *J. Am. Chem. Soc.*, vol. 122, pp. 3554–3555 (2000).

Slichter, C. et al., "5. Spin–Lattice Relaxation and Motional Narrowing of Resonance; Lines, 7. Double Resonance" *Principles of Magnetic Resonance*, Third Enlarged and Updated Edition, pp. 145–151, 247–295 (1978 and 1990).

Smith, J. et al., "Application of Two–Dimensional $^{13}C$ Solid–State NMR to the Study of Conformational Polymorphism," *J. Am. Chem. Soc.*, vol. 120, pp. 11710–11713 (1998).

Smith, J. et al., "Hyperpolarized Xenon–Mediated Cross–Polarization to Material Surfaces Observed at Room Temperature and Above," *J. Am. Chem. Soc.*, vol. 123, pp. 2927–2928 (2001).

Smith, J. et al., "Variable Temperature Study of the Cross-Relaxation Dynamics in the Hyperpolarized Xenon–Induced Enhancement of Surface Nuclei," *J. Phys. Chem. B*, vol. 105, pp. 1412–1421 (2001).

Stejskal, E. et al., "Magic–Angle Spinning and Polarization Transfer in Proton–Enhanced NMR," *Journal of Magnetic Resonance*, vol. 28, pp. 105–112 (1977).

Styles, P. et al., "A High–Resolution NMR Probe in Which the Coil and Preamplifier Are Cooled with Liquid Helium," *Journal of Magnetic Resonance*, vol. 60, pp. 397–404 (1984).

Suryanarayanan, R. et al., "Report: Quantitation of the Relative Amounts of Anhydrous Carbamazepine ($C_{15}H_{12}N_2O$) and Carbamazepine Dihydrate ($C_{15}H_{12}N_2O \cdot 2H_2O$) in a Mixture by Solid–State Nuclear Magnetic Resonance (NMR)," *Pharmaceutical Research*, vol. 7, No. 2, pp. 184–187 (1990).

Zax, D. et al., "Zero field NMR and NQR," *J. Chem. Phys.*, vol. 83, No. 10, pp. 4877–4905 (Nov. 15, 1985).

Zell, M. et al., "Two–Dimensional High–Speed CP/MAS NMR Spectroscopy of Polymorphs. 1. Uniformly ¹³C-Labeled Aspartame," *J. Am. Chem. Soc.*, vol. 121, No. 6, pp. 1372–1378 (1999).

Zell, M. et al., "Investigation of Polymorphism in Aspartame and Neotame Using Solid–State NMR Spectroscopy," *Tetrahedron*, vol. 56, pp. 6603–6616 (2000).

Zhang, G. et al., "Crystallization and transitions of sulfamerazine polymorphs," *J. Pharm. Sci.*, vol. 91, No. 4, pp. 1089–1100 (Apr. 2002).

Zhang, M. et al., "Large–Volume MAS System for Improved Signal–to–Noise Ratio," *Journal of Magnetic Resonance*, vol. 85, pp. 156–161 (1989).

Zhang, M. et al., "Enhanced Signal–to–Noise Ratios in the Nuclear Magnetic Resonance Analysis of Solids, Using Large–Sample Magic–Angle Spinners," *Anal. Chem.*, vol. 62, pp. 633–638 (1990).

Zhu, H. et al., "Physicochemical Characterization of Nedocromil Bivalent Metal Salt Hydrates. I. Nedocromil Magnesium," *J. Pharm. Sci.*, vol. 85, No. 10, pp. 1026–1034 (Oct. 1996).

Zhu, H. et al., "Physicochemical Characterization of Nedocromil Bivalent Metal Salt Hydrates 2: Nedocromil Zinc," *J. Pharm. Sci.*, vol. 86, No. 4, pp. 418–429 (Apr. 1997).

Zhu, H. et al., "Physicochemical Characterization of Nedocromil Bivalent Metal Salt Hydrates: 3. Nedocromil Calcium," *J. Pharm. Sci.*, vol. 86, No. 12, pp. 1439–1447 (Dec. 1997).

* cited by examiner

SOLID-STATE NUCLEAR MAGNETIC RESONANCE PROBE

CROSS REFERENCE TO RELATED APPLICATIONS

This application claims benefit of provisional application Ser. No. 60/445,288, filed on Feb. 4, 2003, which application is incorporated herein by reference.

FIELD OF THE INVENTION

This invention relates to a nuclear magnetic resonance probe for the analysis of solids and semi-solids. In addition, the invention relates to a system that shuttles multiple samples within the probe into and out of a homogeneous field of a superconducting magnet.

BACKGROUND OF THE INVENTION

Solid-state NMR spectroscopy is a powerful technique for the analysis of solids and semi-solids. It is a non-destructive and non-invasive technique that can provide selective, quantitative, and structural information about the sample being analyzed.

Maximizing the utility and increasing sensitivity and sample throughput for the analysis of materials using solid-state NMR spectroscopy is of interest because for most solid samples less than one percent of the time in the magnetic field is spent on data acquisition. The rest of the time (>99%) is spent waiting for the spin populations to return to their equilibrium value via spin-lattice relaxation ($T_1$). However, the spin-spin relaxation time, $T_2$, is usually several orders of magnitude shorter than $T_1$. This means that the preparation and acquisition time in a Fourier Transform solid-state NMR experiment is typically tens of milliseconds. Before the sample can be pulsed again, the sample must relax for several seconds ($T_1$) to several hours as the bulk magnetization returns to its equilibrium value. During this time the sample must remain in a large static magnetic field, but is not required to be in a homogeneous magnetic field.

One example of compounds that have long $T_1$ times is pharmaceutical compounds. New drug compounds often are poorly crystalline or even amorphous, have long relaxation times, and are present at low levels in a formulation. This creates a significant problem for analyzing these compounds using solid-state NMR spectroscopy, because analysis times can range from a few minutes to a few days depending upon the state of the sample (i.e. bulk drug or formulated product), relative sensitivity (i.e. choice and number of different nuclei in molecule), and relaxation parameters. For example, to quantify a mixture of two forms of a compound can take a few hours (for a sample with short relaxation times) to a few days. To analyze a series of formulated products may take a month or more of spectrometer time. This leads to low throughput, high cost per sample analysis, and has relegated solid-state NMR spectroscopy in many cases to be a prohibitively expensive problem-solving technique compared to other analytical techniques such as powder X-ray diffraction, infrared and Raman spectroscopy, and Differential Scanning Calorimetry (DSC).

Also, throughput has been a significant problem in NMR spectroscopy, because the design of the NMR magnet generally allows the analysis of only one sample at a time. Autosamplers have increased throughput by minimizing the time spent changing samples and by allowing continuous use of the spectrometer, but have not increased the number of samples that could be run if samples were changed promptly.

Some researchers have used strategies for the acquisition of multiple signals from multiple probes that are packed within the homogeneous portion of the magnet to maximize the utilization of an expensive analytical tool. For example, Oldfield, et al., A Multiple-Probe Strategy for Ultra-High-Field Nuclear Magnetic Resonance Spectroscopy, J. Mag. Res., Series A 107, 255–257 (1994), discloses the incorporation of more than one probe in the homogeneous part of the magnet that allows for the acquisition of a spectrum for each individual sample. Oldfield discloses a probe that contains three different samples which are all simultaneously located in the homogeneous part of the magnet. Although Oldfield disclosed that the samples were static, he proposed that at least one could incorporate sample spinning. The resolution of this system was quoted as approximately 1 ppm.

The concept in Oldfield was extended to solution NMR spectroscopy by Raftery and coworkers. U.S. Pat. Appl. Pub. No. 2002/0130661 A1. Raftery, et al., have shown that up to four different samples could be located simultaneously in the homogeneous part of the magnetic field. However, the larger the number of samples, the smaller the sample volume must be for all samples to be located simultaneously in the homogeneous region of the magnetic field. This design does not allow for the easy incorporation of magic-angle spinning (MAS) for multiple samples at typical (0.5 cm$^2$) solid sample sizes.

Poor signal to noise ratio (SNR) is also a significant problem in the analysis of materials using solid-state NMR spectroscopy. The most common method used to increase the SNR in samples containing nuclei with low magnetogyric ratios, low natural abundance, and low sample concentration is signal averaging. The SNR in an NMR experiment is proportional to the signal divided by the noise. This relationship is as follows:

$$SNR \propto \left[\frac{N\xi\omega^{3/2}}{T^{3/2}}\right]\left[\frac{QV_c}{F}\right]^{1/2}$$

where N=Nuclear spins per unit volume
  ω=Larmor precession frequency
  ξ=Filling factor of the receiver coil
  °T=Temperature (absolute)
  Q=Quality factor of the receiver coil
  $V_c$=Volume enclosed by the receiver coil
  F=Noise figure of the preamplifier This equation suggests two approaches to improve SNR: increase signal, or decrease noise (or both). The equation for the SNR in a Fourier Transform NMR experiment is shown. This equation assumes that the sample and coil are at the same temperature, and does not take into consideration fixed parameters such as linewidth, magnetogyric ratios, spin quantum numbers, etc. A further discussion of optimizing sensitivity can be found in Freeman. Freeman, R. A Handbook of Nuclear Magnetic Resonance; John Wiley and Sons Inc., New York, 1988.

Increasing the SNR by signal averaging is a problem if the sample has long spin-lattice relaxation times ($T_1$) of minutes, hours, or even days, because the number of transients acquired is limited to one or at most several dozen. Table 1 shows the relaxation times for many of the pharmaceutical solids reported in the literature.

TABLE 1

Relaxation times for various pharmaceutical compounds.

| Compound | $^1$H Resonance Frequency | Recycle Delay | Delay at 400 MHz (9.4 T) |
|---|---|---|---|
| R.O.Y.* | 300 | 40–70 s | 70–125 s |
| Cimetidine | 360 | 15 s | 18 s |
| LY297802 | 400 | 5–10 s | 5–10 s |
| Ephedrine | 200 | 1.5 s | 6 s |
| Aspirin | 300 | 90 s | 160 s |
| Salicyclic Acid | 300 | 1 hr | 1.78 hrs |
| prednisolone t-butylacetate | 200 | 3 s | 12 s |
| Acetaminophen | 200 | 2 s | 8 s |
| Carbamazepine | 200 | 3 s | 12 s |
| Enalapril Maleate | 200 | 2 s | 8 s |
| Ibuprofen | 200 | 2 s | 8 s |

*5-methyl-2-[(2-nitrophenyl)amino]-3-thiophenecarbonitrile

For example, aspirin is a representative pharmaceutical solid that has a $^1$H $T_1$ relaxation time of approximately 30 s at 300 MHz. In a $^{13}$C cross polarization magic-angle spinning (CPMAS) experiment the pulse delay between acquisitions must be at least 90 s to avoid saturation. With salicylic acid, which does not have a methyl group, the delay between acquisitions is greater than 1 hr. It should be noted that some of these compounds may have been chosen because they have relatively short relaxation times, and that the recycle delays may not have been optimized.

One potential solution to the sensitivity problem is to use to higher magnetic fields, but that has several significant disadvantages. First, resolution often will not increase dramatically at higher fields if the linewidth of the sample is limited by bulk magnetic susceptibility or a range of conformations. For example, most drug compounds are still relatively low molecular weight species (<500 MW). At field strengths as low as 7–9 Tesla there is sufficient resolution to identify most, if not all, of the peaks in the spectrum. Second, higher fields require faster spinning speeds to obtain the same separation in ppm between isotropic peaks and spinning sidebands. Increasing the magnetic field from 9.4 Tesla to 18.8 Tesla would require doubling the spinning rate, which usually corresponds to a decrease of at least a factor of two in sample volume. Third, for crystalline solids, especially those without methyl groups, the relaxation rate is often inversely proportional to the square of the magnetic field strength. Going from 7.05 T to 18.8 T would increase relaxation delays by about a factor of seven, mitigating significantly any increased sensitivity gains obtained by going to higher field strengths.

Sensitivity in a MAS experiment can also be improved by increasing the sample volume. However, there are several significant limitations to the development of a large MAS probe capable of cross polarization and high power $^1$H decoupling. They include:

(1) Producing a high-power $^1$H RF field capable of minimal decoupling for a moderately rigid proton environment (approximately 25 kHz);

(2) The ability to spin a large sample at the magic angle with minimal sidebands; and (3) Producing a magnetic field of uniform homogeneity over the entire sample. Unfortunately, the methods needed to overcome each of these limitations are not trivial. For example, while magnetic resonance imaging (MRN) technology requires higher resolution magnetic fields over a much larger sample volume than is needed for solid-state NMR experiments, incorporating such a magnet into a pharmaceutical or chemical laboratory would be quite difficult, especially at high fields (>400 MHz). Large sample volumes inherently mean slower spinning speeds, which is also not desirable. Finally, the ability to adequately decouple the $^1$H nuclei from the X nuclei is extremely problematic, as it would require very high power $^1$H decoupling amplifiers (>4000 W).

Some research groups are currently developing methods to increase nuclear magnetic resonance sensitivity, using techniques such as hyperpolarized xenon or dynamic nuclear polarization (DNP). One recent method that demonstrates substantially increased sensitivity in solution is a cryoprobe that, at considerable expense, keeps the coil and preamplifier at close to liquid helium temperatures. The sensitivity gains occur because of lower noise figures for both the coil and the preamplifier, and a higher Q. Some sacrifice is made in filling factor, which limits the gains in sensitivity. In the solid state, especially for magic-angle spinning (MAS) systems, cooling the coil without cooling the sample would be extraordinarily difficult. Even cooling the system under MAS conditions is technically challenging.

In the solid state, other methods such as variable-amplitude cross polarization (VACP) and two-pulse phase modulation (TPPM) decoupling can improve the signal to noise ratio by approximately 30% for ideal samples. Similar gains can potentially be made by optimizing probe circuitry.

Also, the concept of moving samples into the homogeneous magnetic field only when the spectrum is being acquired has been used to measure relaxation times at different magnetic field strengths, and also to measure dipolar couplings at field strength of zero. In these approaches, the desire was usually to move the sample to a different magnetic field strengths, but not keep all of the samples always in the highest magnetic field strength.

Even with the advances described above, there have been no dramatic improvements in sensitivity and throughput for solid-state NMR spectroscopy for the routine analysis of low abundance nuclei such as $^{13}$C and $^{15}$N since the development of the cross polarization magic-angle spinning (CPMAS) experiment almost three decades ago. Further, none of the currently available techniques improve sensitivity and throughput by repositioning a probe within the bore of the magnet to analyze a different sample and allow the spins of one or more other samples to return to a state that allows a researcher to acquire another spectrum of the one or more other samples.

SUMMARY OF THE INVENTION

Generally, the present invention relates to a system for the analysis of multiple samples contained with a nuclear magnetic resonance probe. One embodiment may include: a probe, the probe comprising, (1) a housing, and (2) a plurality of isolated spinning modules positioned within the housing, the isolated spinning modules being configured to hold different samples for analysis; a repositioning device coupled to the probe, the repositioning device being configured to alter the position of the probe to place a spinning module within the homogeneous portion of a magnet; and an acquisition device coupled to the spinning modules, the acquisition device being configured to acquire a spectrum from only the spinning module that is placed within the homogeneous portion of a magnet.

In another respect, the invention is directed to a nuclear magnetic resonance probe that includes multiple spinning systems. The multiple spinning systems are on isolated circuits and each individual spinning module can be repositioned following data acquisition to allow the spins of the nuclei being analyzed to relax to an equilibrium state while a spectrum is being acquired on a sample contained within another spinning module. The probe includes: a housing, the housing being moveable to different positions within the magnetic field; a plurality of isolated spinning modules positioned within the housing, the isolated spinning modules being configured to hold different samples for sequential solid-state NMR analysis; and wherein the housing is configured for the movement of one of the plurality of modules out of a homogeneous portion of the magnet to allow a sample contained with the one of the plurality of modules to return to an equilibrium state.

In another respect, the invention is directed to a nuclear magnetic resonance spectrometer that includes: a magnet, the magnet defining a bore; a probe, the probe comprising, (1) a housing sized to fit within the bore of the magnet, and (2) a plurality of isolated spinning modules positioned within the housing, the isolated spinning modules being configured to hold different samples for analysis; a repositioning device coupled to the probe, the repositioning device being configured to alter the position of the probe to place a spinning module within the homogeneous portion of a magnet and remove a second spinning from the homogeneous portion of the magnet; and an acquisition device coupled to the spinning modules, the acquisition device being configured to acquire the signal from only one of the isolated spinning modules during an acquisition of a spectrum.

In another respect, the invention is directed to a method for the acquisition of solid-state nuclear magnetic resonance spectra using a probe that includes multiple spinning modules. The method includes the steps of: providing a magnet, the magnet defining a bore; providing a probe, the probe being positioned within the bore of the magnet; providing a plurality of spinning modules within the probe; placing a plurality of samples within the plurality of spinning modules; positioning the probe within the bore of the magnet to position a first spinning module in a first position; acquiring a first spectrum from a first sample contained within the first spinning module; moving the probe from the first position to a second position that positions a second spinning module for the acquisition of a second spectrum from a second sample contained within the second spinning module.

The above summary of the present invention is not intended to describe each disclosed embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE PREFERRED EMBODIMENTS

The present invention relates to solid-state nuclear magnetic resonance (NMR) spectroscopy. In particular, the present invention is directed to the use of a probe that increases sensitivity and throughput of samples being analyzed with solid-state NMR. A magic-angle spinning (MAS) NMR probe is described to increase sensitivity and throughput, the probe including multiple spinning systems. The spinning systems can be rapidly shuttled in and out of a homogeneous region of a static magnetic field of a superconducting magnet. While the spectrum of one sample is being acquired, the magnetization of one or more additional samples contained within separate spinning modules will be returning to equilibrium in the inhomogeneous region of the field. For a probe containing ten spinning modules, the result is an increase in throughput or a decrease in acquisition time by an order of magnitude compared to conventional MAS probes.

As the terms are used in this application, "solid-state" and "sample" refer to any material, compound, or sample that is a solid or semi-solid. As the term is used in this application, "different samples" means samples contained within different spinning modules. The material being analyzed that is contained within the "different samples" may be the same or different. As the term is used in this application, "plurality" means more than one. As the term is used in this application, "coupled" means a direct or indirect connection between two or more elements.

Two-Module Probe Construction

Figure 1:
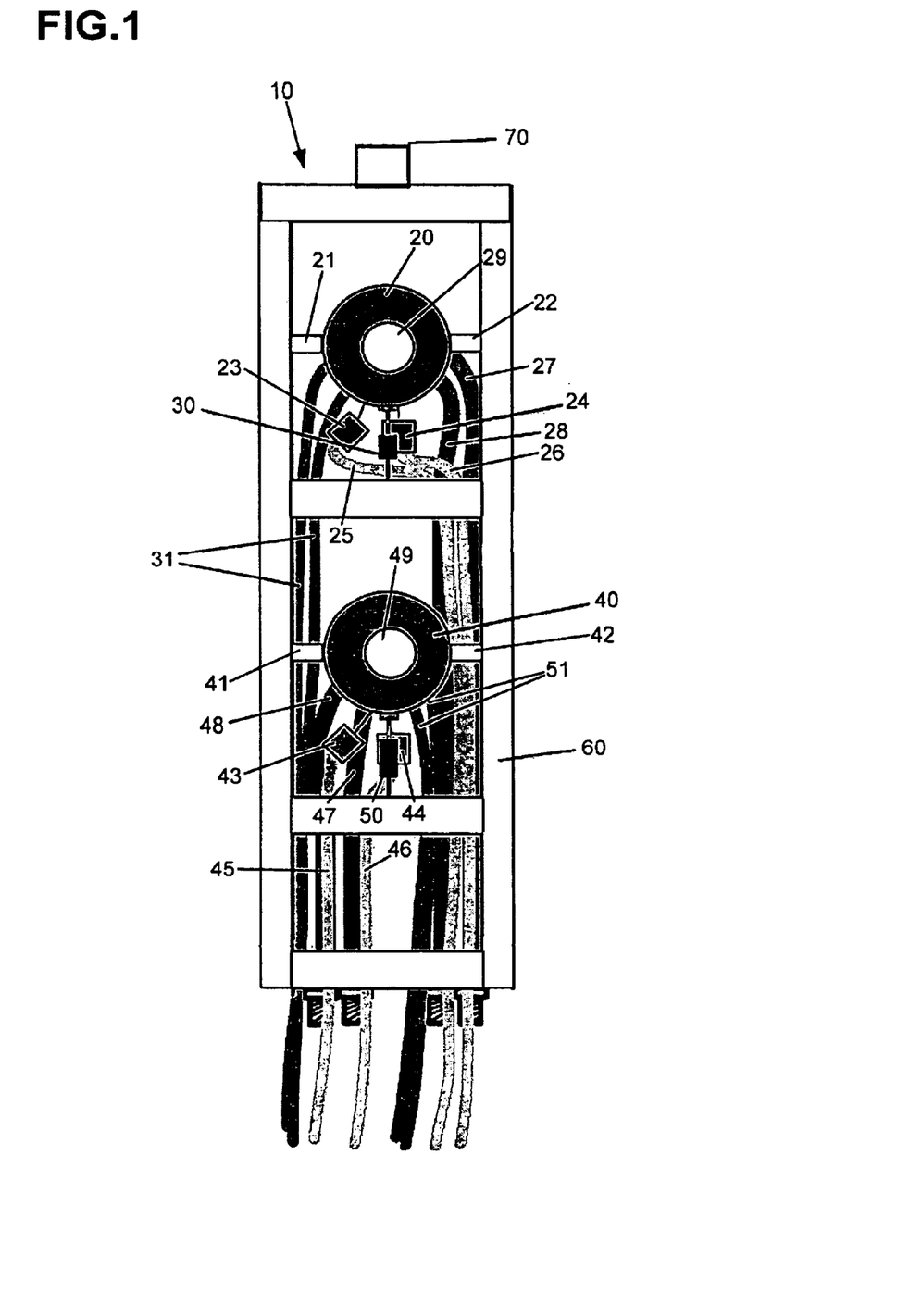
FIG. 1 is a schematic view of an embodiment of a solid-state NMR probe including two spinning modules.

Referring to FIG. 1, one embodiment of a solid-state NMR probe 10 is shown. The NMR probe 10 includes two magic-angle spinning (MAS) systems 20, 40. In alternative embodiments, the number of modules can be increased. MAS spinning systems can be obtained from Varian located in Palo Alto, Calif. Any suitable MAS spinning system can be utilized.

The probe 10 can be constructed to use typical MAS modules (for example, 4 or 7 mm o.d. rotors) and can be designed to maximize throughput of samples. The probe 10 includes a framework or housing 60 that houses the MAS spinning systems or modules 20, 40. A shield (not shown) can be placed around the housing 60 to protect the components of the probe 10 and facilitate the movement of the probe within a magnet. The MAS modules 20, 40 are attached to the housing 60 at attachment points 21, 22 for the first module 20 and attachment points 41, 42 for the second module 40.

The first module 20 includes fixed capacitors 23, 24 (American Technical Ceramics located in Huntington Station, N.Y.) coupled to the first module 20 for the tuning of the first module 20. Fixed capacitors 23, 24 roughly tune (±3 MHz) the RF circuit for this first module 20. Fixed capacitors 23, 24 are coupled to radio frequency (RF) transmission lines 25, 26. RF transmission lines 25, 26 can be coaxial cables.

The system for tuning the first module 20 is preferably compact so that additional modules can be positioned no further than 5 cm apart. Utilizing variable tuning elements in the probe eliminates the need for a mechanism (such as plastic rods) for changing large variable capacitors that tune the circuit for the first module 20. A second portion of the tuning circuit can be located outside the probe. This tuning circuit can be designed for fixed frequencies with fine-tuning of the circuit performed below the magnet.

Gas is provided to first module 20 through first supply lines 27, 28 for the spinning and stabilization of a first sample holder positioned within the first module 20. In solid-state NMR systems incorporating multiple MAS modules, the ability to supply sufficient spinning/bearing air to each module is not trivial. Individual air lines are provided for each module, although space considerations may require alternative methods of supplying the air.

The first sample holder is a standard Pencil™ spinning MAS device that can be purchased from Varian located in Palo Alto, Calif. Supply lines 27, 28 provide gas (preferably air) in order to drive or rotate the first sample holder positioned within a first sample cavity 29 defined by the first module 20 and for bearing of the first sample holder within the first module 20, respectively.

A first MAS adjustment device 30 can be coupled to the first spinning module 20 for adjusting the angle of the first spinning module 20 relative to the magnetic field of a superconducting magnet. The first MAS adjustment device 30 can be used to adjust the angle of the first spinning module 20 and the sample contained with the module 20 to maximize the signal obtained during an experiment conducted on the first sample. An angle of 54.7 degrees relative to the magnetic field of the magnet is preferred.

A first rotation measuring device 31, employing means such as fiber optics, can be coupled to the first spinning module 20 for measuring the rotational speed of the first sample holder contained within the first spinning module 20. A distinctive mark can be placed on the first sample holder to facilitate the measurement of the rotational speed of the first sample holder. Computer control software (such as LabView available from National Instruments located in Austin, Tex.) can be used to maintain spinning speed control for the first sample holder contained within the first module 20.

Like the first module 20, the second module 40 includes fixed capacitors 43, 44 coupled to the second module 40 for the tuning of the second module 40. Fixed capacitors 43, 44 are coupled to radio frequency (RF) transmission lines 45, 46. RF transmission lines 45, 46 can be made of coaxial cables.

The system for tuning the second module 40 is also preferably compact so that additional modules can be positioned no further than 5 cm apart. Utilizing variable tuning elements in the probe eliminates the need for a mechanism (such as plastic rods) for changing large variable capacitors that tune the circuit for the second module 40. A second portion of the tuning circuit can be located outside the probe. This tuning circuit can be designed for fixed frequencies with fine-tuning of the circuit performed below the magnet.

Gas is provided to second module 40 through second supply lines 47, 48 for the spinning and stabilization of a second sample holder positioned within the second module 40. The second sample holder is also a standard Pencil™ spinning MAS device. Supply lines 47, 48 provide gas (preferably air) in order to driver or rotate the second sample holder positioned within a second sample cavity 49 defined by the second module 40 and for bearing of the second sample holder within the second module 40, respectively.

A second MAS adjustment device 50 can be coupled to the second spinning module 40 for adjusting the angle of the second spinning module 40 relative to the magnetic field of a superconducting magnet. The MAS adjustment device 50 can be used to adjust the angle of the second spinning module 40 and the sample contained with the module 50 to maximize the signal obtained during an experiment conducted on the second sample. An angle of 54.7 degrees relative to the magnetic field of the magnet (magic angle) is preferred.

A second rotation measuring device 51, employing means such as fiber optics, can be coupled to the second spinning module 40 for measuring the rotational speed of the second sample holder contained within the second spinning module 40. A distinctive mark also can be placed on the second sample holder to facilitate the measurement of the rotational speed of the second sample holder. The same computer control software used for the first sample holder can be used to maintain spinning speed control for the second sample holder contained within the second module 40.

The closer the modules such as modules 20, 40 are to each other, the more samples can be maintained in the main $B_o$ field (approximately 90% $B_o$). Depending on the system utilized, the minimum distance between spinning modules that does not sacrifice RF performance or magnetic field homogeneity can be determined. Also, depending on the experiment sought to be conducted, the experimenter may have to compromise between the amount of time a sample spends in a lower magnetic field, the net relaxation occurring in that field, and the relaxation delay between pulses.

Each spinning module 20, 40 can be moved rapidly from one point in the magnet to another. Often, this movement could be several tens of centimeters, if the signal is acquired in a non-sequential manner. Utilization of a system that provides the fastest movement with sufficient accuracy to place each module within 2 mm of its previous position in the homogeneous part of the magnetic field is preferred.

Each spinning module 20, 40 may have different field homogeneity requirements, requiring separate shim parameters. Changes in shim values can be incorporated with switching data acquisition from one module to another.

The magic angle of the MAS modules 20, 40 can be adjusted at the bottom of the NMR probe 10. This can be done by having individual MAS adjustors extending from the bottom of the probe 10. Preferably, a single MAS adjustor can be used to replace a system that has multiple MAS adjustors extending out of the probe. This MAS adjustor, which can be adjusted to reposition both of the modules 20, 40, requires that the probe 10 be lowered out of a magnet for adjustment of the magic angle. Since the probe 10 is designed to be raised and lowered within the magnet, having the probe extend below the magnet would also enhance sample changing.

Commercially available software, such as Spinsight software used on a commercial spectrometer, such as a Chemagnetics spectrometer, is capable of acquiring the spectra of the spinning modules 20, 40 using either two dimensional software or switching data buffers between acquisitions.

High-power RF switches can be used to direct the output to the individual circuits for the modules 20, 40. Switches are available with power handling capabilities of >350 W CW and switching times of <20 ms. Alternatively, separate spectrometers can be utilized to control and acquire data from the separate modules 20, 40. Other known techniques for control and acquisition of data from the modules 20, 40 can also be utilized.

The MAS modules 20, 40 can be moved into the homogeneous region of the magnet for acquisition of signal. When the signal for a module, such as module 20, is not being acquired, the module can be moved into a different region of the magnetic field. As shown in FIG. 1, an attachment device 70 can be coupled to the housing 60. Any suitable repositioning mechanism can be coupled to the attachment device 70 to control the position of probe 10. The MAS modules 20, 40 can be moved in the bore of the magnet using an electric, hydraulic, or other mechanism that can change the location of the MAS modules 20, 40 in a bore of the magnet.

Probe 10 has the capability of drastically increasing throughput by a factor of 2–20, depending upon the number of spinning modules/samples that are being analyzed. This number could be significantly higher, if the analysis time for one of the samples was several days. During that time, the samples in the other spinning modules could be changed several times without disturbing the sample with the long analysis time.

The analysis of salicylic acid is an example of this, where the pulse delay at a magnet field strength of 7.05 Tesla is 3600 s. In conventional systems, an acquisition count is limited to <24 acquisitions. With a probe, such as probe 10 or other probes that include more than two modules, the sample can remain in the spectrometer for weeks without significantly affecting throughput.

This system can be automated to run an experiment without human intervention for an extended period of time. A variant of the Varian Nano™ probe MultiSampler (NMS), which lowers a probe containing a MAS module, changes samples, and then returns the probe to its original location, can also be used to facilitate such an experiment. The throughput advantage could be increased to 10–100 compared to a probe with no autosampler, if the samples are changed five times during an experiment that last for one or several days.

Utilizing a probe such as probe 10 results in little or no loss in field homogeneity, sensitivity, MAS speed, or $^1$H decoupling field strength compared to conventional NMR probes. While this approach can be used at any magnetic field strength, preferable, it works better at higher field strengths, where $T_1$ relaxation rates are much longer than at lower field strengths. Higher fields also imply faster spinning systems and therefore smaller sample volumes. However, this means that more spinning systems could be placed in the static magnetic field, enabling more samples to be run.

Figure 2:
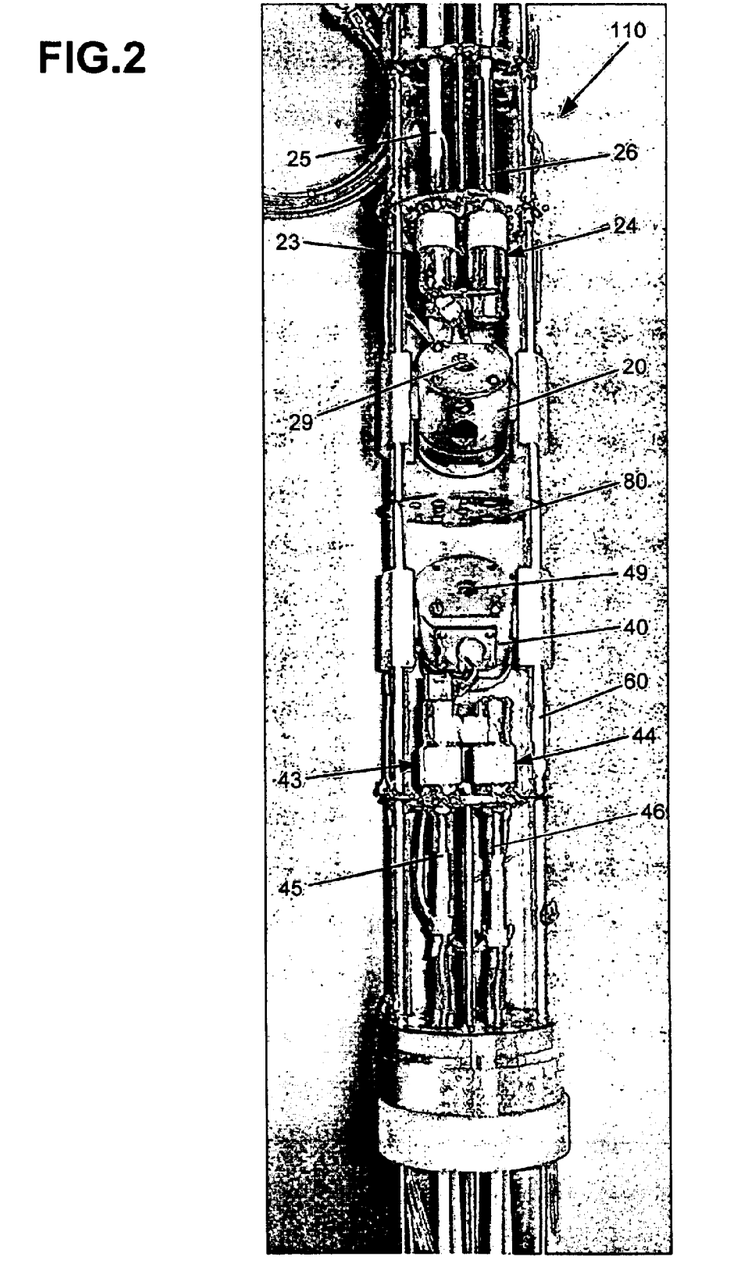
FIG. 2 is a photographic view of a second embodiment of a solid-state NMR probe including two spinning modules.

Referring to FIG. 2, a second embodiment of a multiple module solid-state NMR probe 110 is shown. This probe 110 is similar to probe 10. Many of the parts of probe 110 are the same as the parts in probe 10 and like parts are indicated with like numbers from probe 10 shown in FIG. 1.

Probe 110 also includes a RF isolation shield 80 positioned between the spinning modules 20, 40. RF isolation shield 80 reduces cross talk between coils contained within modules 20, 40. In probe 110, the coils are approximately 5 cm apart.

As shown in FIG. 2, the RF transmission lines 25, 26 are coupled to the first module 20 from the top of the probe 110 and RF transmission lines 45, 46 are coupled to the second module 40 from the bottom of the probe 110.

Figure 3:
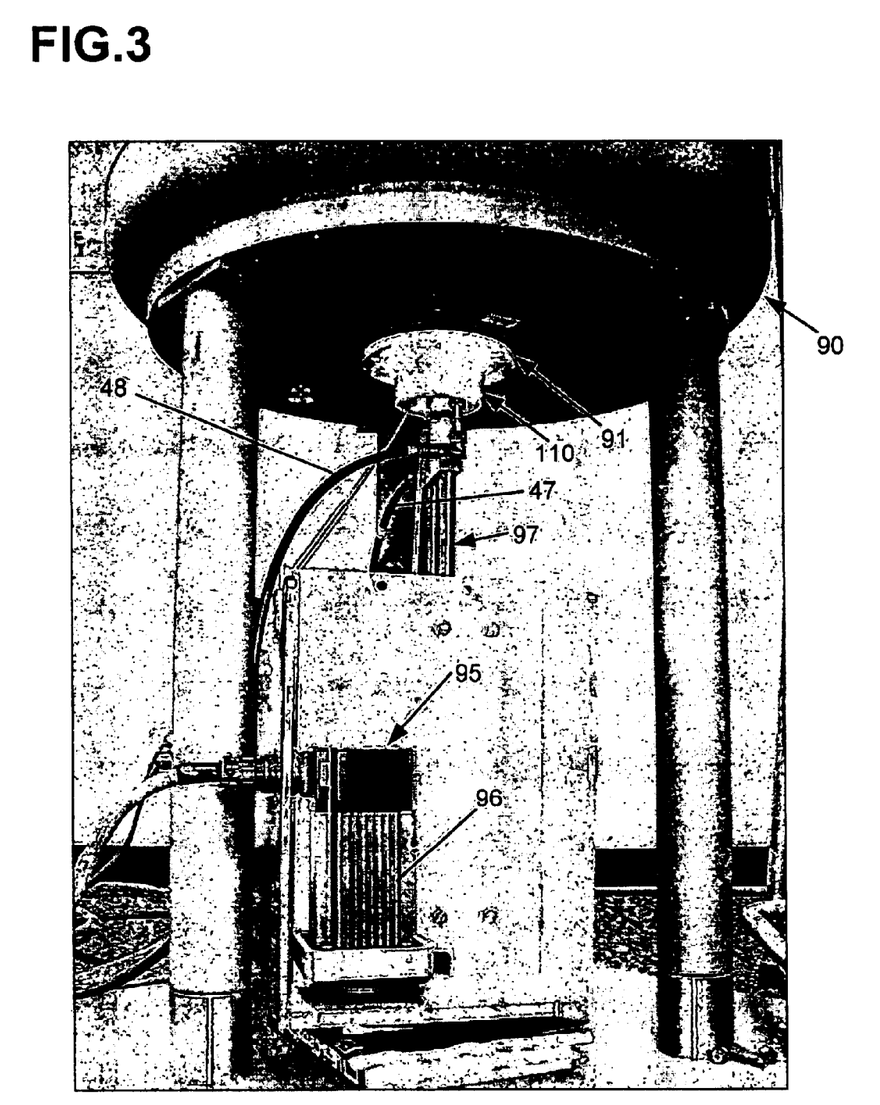
FIG. 3 is a photographic view of the probe of FIG. 2 located within a bore of a magnet.

Referring to FIG. 3, the probe 110 of FIG. 2 is shown positioned within a superconducting magnet 90. Probe 110 is inserted into the bore 91 of the magnet 90. A repositioning device 95 (device that switches the position of spinning modules) or any other device that can be used to alter the position of the probe 110 within the bore 91 of the magnet 90 is coupled to the probe 110. In one embodiment, the repositioning device 95 includes a stepper motor 96. The stepper motor 96 is coupled to a probe movement assembly 97 (attachment device). Repositioning device 95 of FIG. 3 employs an Emerson stepper motor DXM-318 and controller MO35318. Gas lines 47, and 48 are shown coupled to the probe 110. Other electric or hydraulic repositioning devices can be used to change the location of the MAS modules 20, 40 within the bore 91 of the magnet 90.

The two-module probe 110 shown in FIGS. 2 and 3 is a double-resonance ($^1$H—$^{13}$C) probe, which results in two RF transmission lines being coupled to each of the spinning modules 20, 40.

The probe shown in FIG. 2 includes two separate coils distanced approximately 5 cm apart. This along with RF isolation shield 80 reduces cross-talk between coils. Alternatively, other known methods to isolate the RF coils can be implemented such as those described in U.S. Pat. Appl. Pub. No. 2002/0130661 A1.

Greater Than Two Module Probes and Spectrometers

Figure 4:
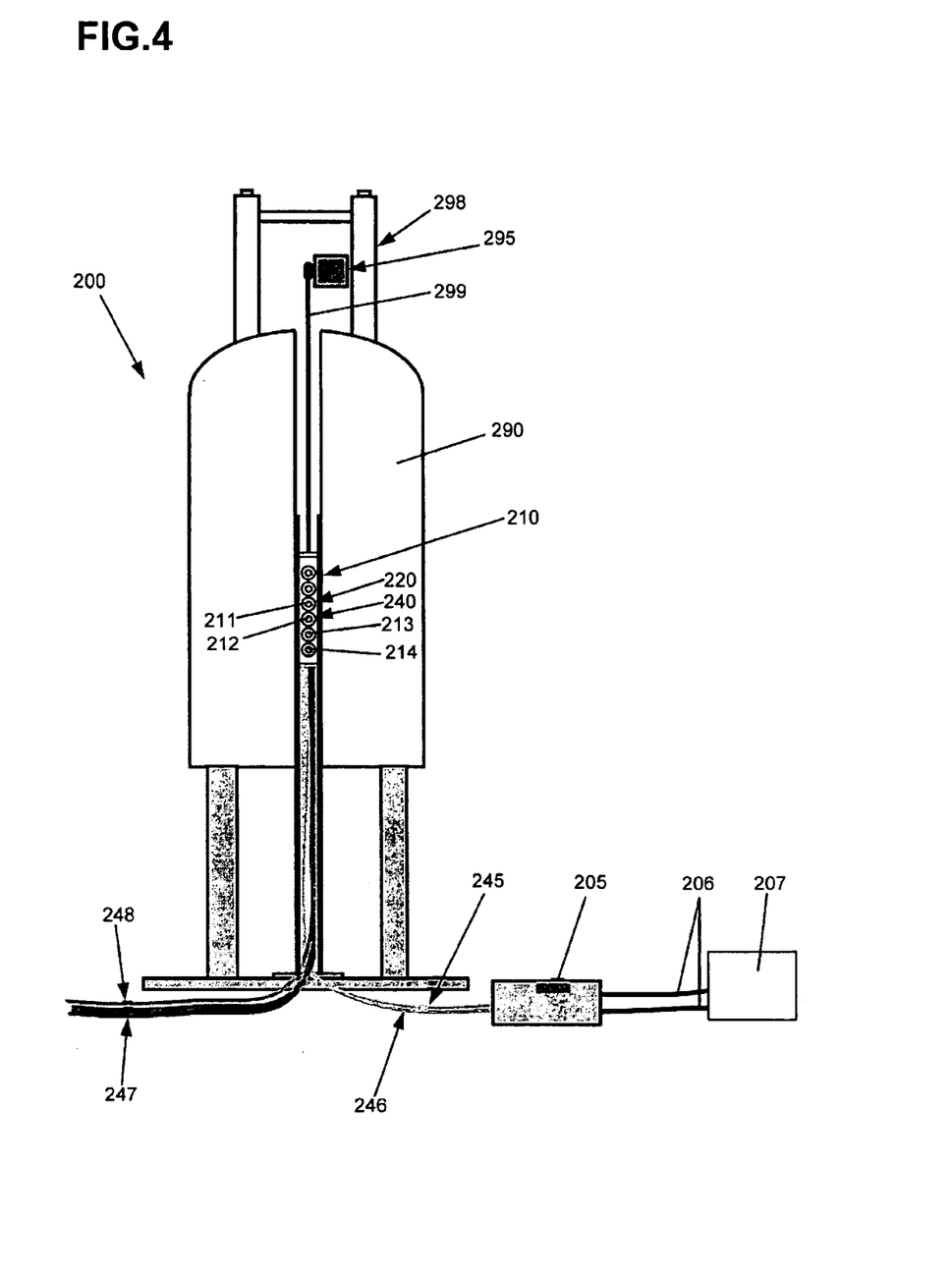
FIG. 4 is a solid-state nuclear magnetic spectrum of a KBr sample placed within a spinning module of FIG. 2 and acquired while within the bore of the magnet as shown in FIG. 3.

Referring to FIG. 4, an embodiment of a solid-state NMR spectrometer 200 is shown. The spectrometer 200 includes a probe 210 that includes six spinning modules. Alternatively, more or less spinning modules can be utilized so long as there is more than one spinning module. The probe 210 is positioned within the bore 291 of a superconducting magnet 290. A microstepper assembly (repositioning device) is shown attached to an upper portion 298 of the superconducting magnet 290. A repositioning cable 299 is attached to the probe 210 to facilitate the movement of the probe 210 within the magnet 290. Attachment to the probe 210 can be achieved with an attachment device, such as attachment device 70 of FIG. 1.

RF transmission lines 245 and 246 are used to connect the probe 210 to a remote RF tuning device and switching box, collectively 205. Although shown as being housed within a single device, the RF tuning device and switching box can be separately housed. This box 205 serves two purposes. First, each MAS module/circuit can be selected independently for signal acquisition. High-power RF switches can be used to direct the output to the individual circuits for the modules. As described above, switches are available with power handling capabilities of >350 W CW and switching times of <20 ms. Alternatively, separate spectrometers can be utilized to control and acquire data from the separate modules within probe 210. Second, the location of box 205 allows each circuit to be tuned independently outside of the magnet, which conserves space.

The box 205 is coupled through connections 206 to other standard components of the spectrometer including high-power amplifiers, a pre-amplifier, and a receiver (acquisition device), collectively shown as spectrometer components 207.

Gas lines 247, 248 are also coupled to the probe 210. Lines 247 and 248 provide the drive and bearing gas for the sample holders within the spinning modules. Although only two gas lines 247, 248 are shown in FIG. 4, additional gas lines can be utilized to provide each spinning module with separate drive and bearing gas.

Probe 210 operates for the sequential analysis of different samples contained within a solid-state NMR probe as follows. First, a spectrum of a sample 211 contained within one spinning module 220 is acquired. While the magnetization of sample 211 is returning to equilibrium, it is removed from the homogeneous region of the magnetic field and another sample 212 housed within a separate spinning module 240 that has been relaxing in the inhomogeneous magnetic field is moved into the homogeneous field region. A spectrum of sample 212 is then acquired. After acquisition, it is possible to switch back to sample 211 after the magnetization for sample 211 has returned to equilibrium. If sample 211 has not yet returned to equilibrium, then it would be possible to switch to sample 213, or sample 214, etc. If it is possible to switch to five samples before the magnetization in sample 211 has returned to equilibrium, and the other samples contain the same material as sample 211, then the SNR will be increased by a factor of the square root of six, or 2.45.

Switching to eight other samples will increase the SNR by a factor of three. With this design it is also possible to run ten different samples, which would correspond to an increase of a factor of ten in throughput, which is potentially more valuable than an increase in signal to noise. Automated sample changing can be utilized to further increase throughput.

Preferably, each MAS spinning module shown in FIG. 4 includes its own air supply lines, radio-frequency connections, and magic-angle adjustment mechanism, although some or all of these features may be combined as described above for probes 10 and 110. Each spinning module may have variable-temperature capability, independent spinning speed control, and independent shimming parameters.

EXAMPLES

Figure 5:
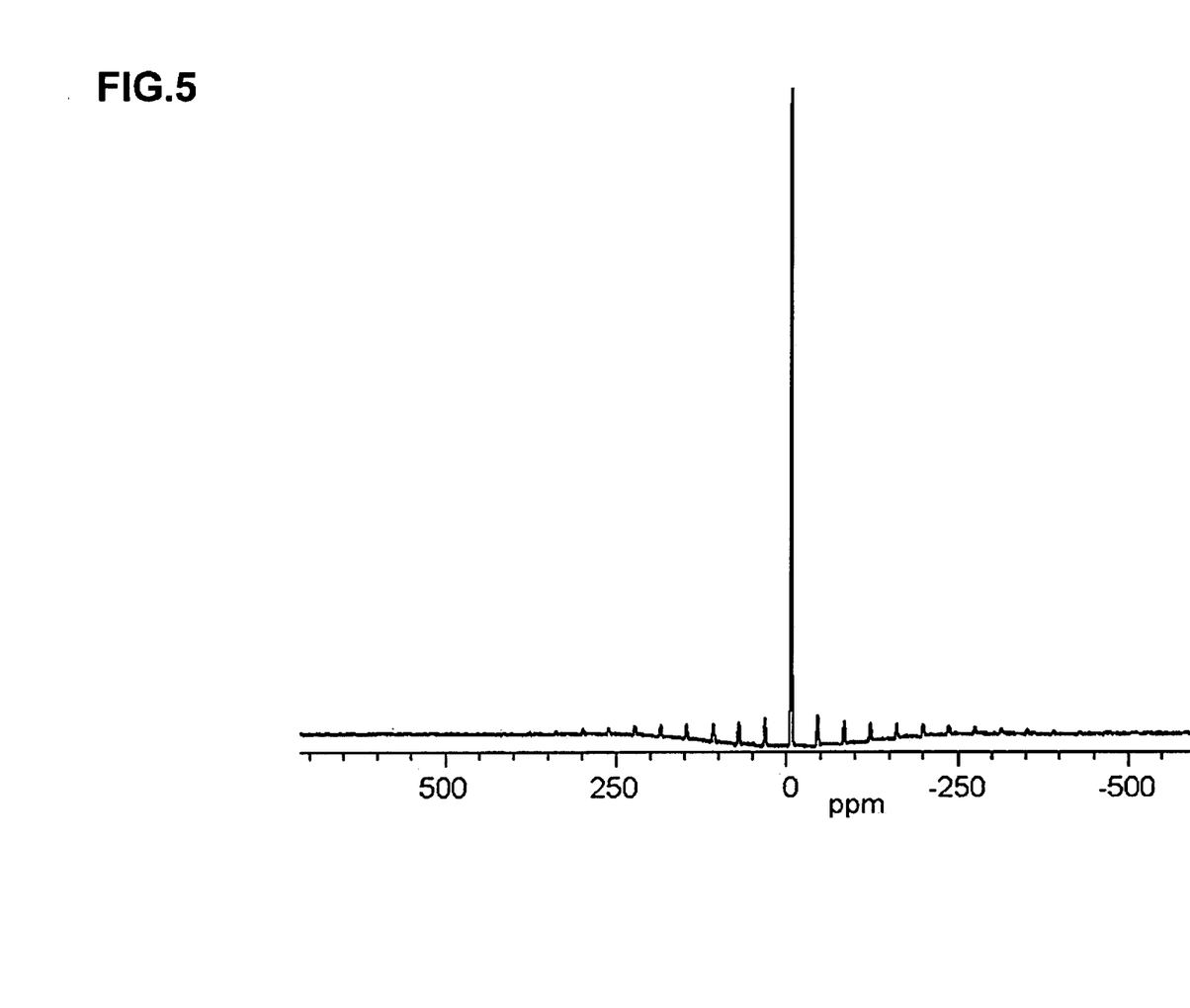
FIG. 5 is a schematic view of an embodiment of a solid-state NMR spectrometer utilizing a third embodiment of a probe.

Referring to FIG. 5, a solid-state $^{79}$Br magic-angle spinning NMR spectrum of KBr was obtained through the use of the probe shown in FIGS. 2 and 3. All $^{79}$Br spectra were acquired on a Chemagnetics CMX-300 spectrometer using single-pulse excitation and magic-angle spinning. KBr was packed into 7.5 mm zirconia rotors and spun at 3 kHz in a multiple-sample probe outfitted with two Pencil™ spinning modules. Kel-F endcaps were used to hold the sample in the rotor.

The two-module double-resonance ($^1$H—$^{13}$C) probe shown in FIGS. 2 and 3 contained two Pencil™ spinning modules. The probe circuit was tuned to both $^1$H and $^{13}$C, although for the KBr experiments the $^{13}$C circuit was retuned to $^{79}$Br. Retuning required a simple adjustment of the variable tune and match capacitor. The circuit was based upon a double-resonance design using a combination of fixed (American Technical Ceramic) and variable capacitors (Polyflon Company located in Norwalk, Conn.) for tuning and matching of the circuit, with a quarter wave cable on the proton side for isolation of signal. A quarter wave cable was not necessary on the carbon side of the tuning circuit for proton isolation. The design of NMR probes and circuits is well-established, especially at low frequencies. Details on the construction of this type of circuit for solid-state NMR can be found in Chapter 5 of "High Resolution NMR in the Solid State—Fundamentals of CP/MAS", E. O. Stejskal and J. D. Memory, Oxford University Press, New York, 1994. Isolation between channels was found to be >20 dB. Both the $^1$H and $^{13}$C sides of the circuit showed adequate power handling capabilities for cross-polarization MAS (CPMAS) spectroscopy, and were comparable to a conventional single-module NMR probe. A $^{13}$C CPMAS NMR spectrum with proton decoupling of hexamethylbenzene (HMB) was acquired using one of the modules. The signal-to-noise ratio for KBr was comparable between the circuit used in the multiple-sample probe and the conventional single-module probe used to routinely acquire spectra on this spectrometer. The ability to acquire a spectrum using magic-angle spinning after movement of the probe in the magnet was evaluated.

In dynamic-angle spinning experiments, the spinning module can be rapidly switched (<100 ms) between two different angles with respect to the static magnetic field, demonstrating that rapid movement of spinning modules is possible while maintaining the magic-angle spinning. In probe 110 of FIGS. 2 and 3, the angle is not switched, but the physical location of the spinning module in the static magnetic field was changed. A schematic representation of one embodiment of an experimental setup of this type is shown in FIG. 4.

The probe is inserted into the magnet and is attached to a repositioning device, which is composed of an Emerson stepper motor DXM-318 and controller MO35318. A computer was used to control the timing and speed of the stepper motor. The rotational motion of the stepper motor was converted into vertical motion by using a worm-type gear arrangement. In order to test the ability of the probe to acquire signals after sample movement, the probe was raised and lowered in the magnetic field by about 8 cm while the sample was spinning at 2–4 kHz. The spinning speed did not seem to change during the experiment. The module was maintained in the homogeneous region of the magnetic field for approximately 10 s, and then moved 8 cm to bring the other module into the homogeneous region of the magnetic field. The duration of the movement was less than 2 s, and in some experiments less than 1 s.

A spectrum of KBr using 2048 acquisition points from one of the modules was acquired approximately every 0.5 s during the entire process. A spectrum from the other module could have easily been acquired by either using two NMR spectrometers or a switch to select one of the two modules, but since both circuits and modules are identical, the results from one module would have been duplicated on the other module. The spectra showed that an NMR spectrum equivalent to that obtained in a conventional single-module NMR probe could be acquired within 0.5 s of the stopping of module movement in the homogeneous region of the magnetic field.

Applications

Some general applications of the embodiments of the probe designs described above include:

(1) Utilizing the methodology and probe designs described for the analysis of: pharmaceuticals, glasses, polymers, catalysts, and other solid and semi-solid materials, systems, and compounds.

(2) Utilizing the methodology and probe designs described to improve the identification, detection, and quantitation of drug forms and deriving information on drug stability from the NMR data.

(3) Enhancing solid-state NMR sensitivity and throughput: the methodology and probe designs described above increases throughput in solid-state NMR experiments by an order of magnitude. As NMR spectrometers approach 1 GHz in frequency and five to ten million dollars in cost, the ability to run multiple samples on the same instrument will have a tremendous impact by increasing the amount of science that can be performed using these spectrometers.

(4) Use of solid-state NMR spectroscopy for the analysis of pharmaceuticals: Form changes in pharmaceuticals during the manufacturing and production process can affect important properties such as bioavailability. Ritonavir, a protease inhibitor, is a recent example of a drug in which the solid form was removed from the market because of form changes. Solid-state NMR spectroscopy with probes, such as the ones described above, can increase the ability to detect form changes at very low levels, and could identify potential problems with formulations before bioavailability is affected.

One specific use of the embodiments of the probe designs described above includes:

Identification of amorphous material in pharmaceuticals: small amounts of amorphous material is often present in pharmaceutical formulations because of milling, drying, grinding, and mixing with excipients. The amorphous component is usually much less stable than the crystalline material, and therefore degrades much faster. The determination of amorphous content in pharmaceuticals is almost always limited by the SNR. The detection limit for amorphous content of materials can be improved with the probes described above.

Utilization of Multiple Spinning Module Probe as a High-Field Probe

A major benefit of the systems described above is that it is ideally suited to operate at high fields, where relaxation times are long and spectrometer time is at a premium. These probes can be used with spectrometers having field strengths of 800 MHz or greater.

Combination of Multiple Spinning Module Probe with Large-Volume Probe

A solid-state NMR probe that has a substantial increase in SNR (approximately 30) compared to a traditional 7 mm NMR probe can be constructed. The combination of large sample volumes (×4) with multiple spinning modules (×3) and lower temperatures (minimum of ×2.5) can result in an increase in the SNR by a factor of 30, corresponding to a savings in time by a factor of 900. One primary applications for this probe is the analysis of pharmaceutical formulations that contain <10% of active drug ingredient and for the assignment of NMR spectra using experiments such as INADEQUATE. Increasing SNR can be achieved in several ways. For example, a factor of three increase in SNR will be achieved by using nine spinning modules instead of one.

A factor of four increase in SNR will be achieved by increasing the sample volume. Using a 2.5 cm rotor, enhancement in SNR of 4–5 could be obtained compared to spinning systems of approximately 0.5 $cm^2$. Moreover, previous experiments using a large-volume spinning system acquired show that adequate decoupling powers (>35 kHz) and MAS speeds (approximately 3 kHz) could be achieved in a system of this volume. Larger sample volumes would require prohibitory RF power levels for $^1H$ decoupling. One of the advantages of the INADEQUATE pulse sequence is that only modest decoupling powers and spinning speeds are necessary.

A factor of 2.5 increase in SNR will be achieved by lowering the sample and probe temperature. By reducing the sample temperature to 150 K, the population difference would increase by a factor of 2. In addition, the SNR should increase by a factor of 1.4 because of lower thermal noise of the coil. Also, decoupling may become more efficient by increasing the Q factor. The disadvantage is that at lower temperatures, the $T_1$ may be substantially longer, and the improvement in SNR achieved by going to lower temperatures may not be realized.

The present invention should not be considered limited to the particular examples or materials described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A solid-state nuclear magnetic resonance probe for use in a magnetic field, the probe comprising:
    a housing, the housing being moveable to different positions within the magnetic field;
    a plurality of isolated spinning modules positioned within the housing, the isolated spinning modules being configured to hold different samples for sequential solid-state NMR analysis; and
    wherein the housing is configured for the movement of one of the plurality of modules out of a homogeneous portion of the magnet to allow a sample contained with the one of the plurality of modules to return to an equilibrium state.

2. The probe of claim 1, further comprising an attachment device coupled to the housing, the attachment device being configured to receive a repositioning device.

3. The probe of claim 2, wherein the repositioning device moves the one of the plurality of modules out of the homogeneous portion of the magnet.

4. The probe of claim 1, further comprising a radio-frequency isolation shield, the radio-frequency isolation shield configured to reduce cross-talk between spinning modules.

5. The probe of claim 1, wherein the different samples contain the same material for analysis.

6. A system for use in solid-state nuclear magnetic resonance spectroscopy, the system comprising:
    a probe, the probe comprising,
        (1) a housing, and
        (2) a plurality of isolated spinning modules positioned within the housing, the isolated spinning modules being configured to hold different samples for analysis;
    a repositioning device coupled to the probe, the repositioning device being configured to alter the position of the probe to place a spinning module within the homogeneous portion of a magnet; and
    an acquisition device coupled to the spinning modules, the acquisition device being configured to acquire a spectrum from only the spinning module that is placed within the homogeneous portion of a magnet.

7. The system of claim 6, wherein the repositioning device is a stepper motor.

8. The system of claim 6, further comprising a receiver coupled to the probe for obtaining the spectrum.

9. A solid-state nuclear magnetic resonance spectrometer, comprising:
    a magnet, the magnet defining a bore;
    a probe, the probe comprising,
        (1) a housing sized to fit within the bore of the magnet, and
        (2) a plurality of isolated spinning modules positioned within the housing, the isolated spinning modules being configured to hold different samples for analysis;
    a repositioning device coupled to the probe, the repositioning device being configured to alter the position of the probe to place a spinning module within the homogeneous portion of a magnet and remove a second spinning from the homogeneous portion of the magnet; and
    an acquisition device coupled to the spinning modules, the acquisition device being configured to acquire the signal from only one of the isolated spinning modules during an acquisition of a spectrum.

10. The system of claim 9, wherein the repositioning device is a stepper motor.

11. The system of claim 9, further comprising a receiver coupled to the probe for obtaining the spectrum.

12. The system of claim 9, wherein the magnet is a superconducting magnet.

13. A method for the analysis of sample, the method comprising the steps of:
- providing a magnet, the magnet defining a bore;
- providing a probe, the probe being positioned within the bore of the magnet;
- providing a plurality of spinning modules within the probe;
- placing a plurality of samples within the plurality of spinning modules;
- positioning the probe within the bore of the magnet to position a first spinning module in a first position;
- acquiring a first spectrum from a first sample contained within the first spinning module;
- moving the probe from the first position to a second position that positions a second spinning module for the acquisition of a second spectrum from a second sample contained within the second spinning module.

14. The system of claim 13, wherein the step of moving the probe from a first position to a second position comprises providing a stepper motor to control the position of the probe.

* * * * *

UNITED STATES PATENT AND TRADEMARK OFFICE
CERTIFICATE OF CORRECTION

PATENT NO. : 6,937,020 B2  Page 1 of 1
APPLICATION NO. : 10/772778
DATED : August 30, 2005
INVENTOR(S) : Munson et al.

It is certified that error appears in the above-identified patent and that said Letters Patent is hereby corrected as shown below:

Page 2, (56) References Cited, OTHER PUBLICATIONS, First Reference to Dong, Z. et al.: "Monohydratem" should read --Monohydrate--

Page 2, (56) References Cited, OTHER PUBLICATIONS, Reference to MacNamara, E. et al.: "paralle" should read --parallel--

Page 3, (56) References Cited, OTHER PUBLICATIONS, Reference to Smith, J. et al.: "Smith, J." should read --Smith, L.--

Column 3
Line 62, "MRN" should read --MRI--

Column 13
Line 33, "cm" should read --$cm^2$--

Signed and Sealed this

Eighteenth Day of July, 2006

JON W. DUDAS
*Director of the United States Patent and Trademark Office*